(12) United States Patent
Uno et al.

(10) Patent No.: US 12,191,166 B2
(45) Date of Patent: Jan. 7, 2025

(54) SUBSTRATE PROCESSING APPARATUS AND SUBSTRATE PROCESSING METHOD

(71) Applicant: Tokyo Electron Limited, Tokyo (JP)

(72) Inventors: Takashi Uno, Koshi (JP); Satoshi Okawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 249 days.

(21) Appl. No.: 17/425,046

(22) PCT Filed: Jan. 15, 2020

(86) PCT No.: PCT/JP2020/001039
§ 371 (c)(1),
(2) Date: Jul. 22, 2021

(87) PCT Pub. No.: WO2020/153189
PCT Pub. Date: Jul. 30, 2020

(65) Prior Publication Data
US 2022/0130689 A1    Apr. 28, 2022

(30) Foreign Application Priority Data
Jan. 23, 2019  (JP) ................................ 2019-009257

(51) Int. Cl.
*H01L 21/67* (2006.01)
*H01L 21/02* (2006.01)

(52) U.S. Cl.
CPC .. *H01L 21/67028* (2013.01); *H01L 21/02334* (2013.01); *H01L 21/67063* (2013.01)

(58) Field of Classification Search
CPC ......... H01L 21/67028; H01L 21/02334; H01L 21/67063; H01L 21/02002;
(Continued)

(56) References Cited

U.S. PATENT DOCUMENTS

2015/0140785 A1    5/2015  Kwak
2021/0039203 A1*   2/2021  Tanoue ................. B23K 26/57

FOREIGN PATENT DOCUMENTS

JP    H9-216152 A     8/1997
JP    2001-118824 A   4/2001
(Continued)

OTHER PUBLICATIONS

International Search Report of PCT/JP2020/001039 dated Mar. 10, 2020.
(Continued)

*Primary Examiner* — Alexander Markoff
(74) *Attorney, Agent, or Firm* — Shih IP Law Group, PLLC.

(57) ABSTRACT

A substrate processing apparatus configured to process a combined substrate in which a first substrate having thereon a device layer and a second substrate are bonded to each other includes a holder configured to hold a rear surface of the second substrate; a processing unit configured to process the first substrate held by the holder; a first processing liquid supply configured to etch a front surface of the first substrate by supplying a first processing liquid to the front surface of the first substrate opposite to a surface thereof where the device layer is provided; and a second processing liquid supply configured to remove a metal contaminant on the rear surface of the second substrate by supplying a second processing liquid to the rear surface of the second substrate.

7 Claims, 19 Drawing Sheets

(58) Field of Classification Search
CPC ........... H01L 21/02057; H01L 21/6708; H01L 21/67092; H01L 21/67051; H01L 21/304; H01L 21/306; H01L 24/00; H01L 21/30604; B08B 3/02; B23K 26/53; B24B 7/228

See application file for complete search history.

(56) References Cited

FOREIGN PATENT DOCUMENTS

| | | | |
|---|---|---|---|
| JP | 2003-007664 A | | 1/2003 |
| JP | 2004-111606 A | | 4/2004 |
| JP | 2006-108532 A | | 4/2006 |
| JP | 2009-131942 A | | 6/2009 |
| JP | 2009-135342 A | | 6/2009 |
| JP | 2011-060893 A | | 3/2011 |
| JP | 2011-159798 A | | 8/2011 |
| JP | 2012-064667 A | | 3/2012 |
| JP | 2012-069736 A | | 4/2012 |
| JP | 2014-167966 A | | 9/2014 |
| JP | 2015-516672 A | | 6/2015 |
| JP | 2017-011011 A | | 1/2017 |
| JP | 2017-024039 A | | 2/2017 |
| JP | 2017-071074 A | | 4/2017 |
| JP | 2017-191825 A | | 10/2017 |
| JP | 2018-043340 A | | 3/2018 |
| JP | 2018-147908 A | | 9/2018 |
| KR | 100757849 | * | 9/2007 |
| KR | 20080021203 | * | 3/2008 |
| WO | 2013/126927 A2 | | 8/2013 |
| WO | 2017018219 A1 | | 2/2017 |
| WO | WO2017018219 | * | 2/2017 |
| WO | WO 2017/026279 | | 7/2018 |
| WO | WO 2019/176589 | * | 2/2021 |
| WO | WO 2019208359 | * | 5/2021 |

OTHER PUBLICATIONS

International Search Report of PCT/JP2019/028310 dated Oct. 8, 2019.

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2020/001039 filed on Jan. 15, 2020, which claims the benefit of Japanese Patent Application No. 2019-009257 filed on Jan. 23, 2019, the entire disclosures of which are incorporated herein by reference.

TECHNICAL FIELD

The various aspects and embodiments described herein pertain generally to a substrate processing apparatus and a substrate processing method.

BACKGROUND

Patent Document 1 describes a manufacturing method for a semiconductor device. In this manufacturing method, after a semiconductor substrate is thinned to a required thickness by grinding a second main surface of the semiconductor substrate, an etching processing is performed on the second main surface of the ground semiconductor substrate by discharging a required chemical liquid onto this second main surface.

PRIOR ART DOCUMENT

Patent Document 1: Japanese Patent Laid-open Publication No. 2011-060893

DISCLOSURE OF THE INVENTION

Problems to be Solved by the Invention

Exemplary embodiments provide a technique capable of etching, after thinning a front surface of a substrate, the front surface of the substrate appropriately while removing a metal contaminant on a rear surface of the substrate.

Means for Solving the Problems

In an exemplary embodiment, a substrate processing apparatus is configured to process a combined substrate in which a first substrate having thereon a device layer and a second substrate are bonded to each other. The substrate processing apparatus includes a holder configured to hold a rear surface of the second substrate; a processing unit configured to process the first substrate held by the holder; a first processing liquid supply comprising a first processing liquid supply line through which a first processing liquid configured to etch a front surface of the first substrate is supplied to the front surface of the first substrate opposite to a surface thereof where the device layer is provided, and a valve configured to control a supply of the first processing liquid; a second processing liquid supply comprising a second processing liquid supply line through which a second processing liquid configured to remove a metal contaminant on the rear surface of the second substrate is supplied to the rear surface of the second substrate, and a valve configured to control a supply of the second processing liquid; and a rinse liquid supply comprising a rinse liquid supply line through which a rinse liquid is supplied to the rear surface of the second substrate, and a valve configured to control a supply of the rinse liquid.

Effect of the Invention

According to the exemplary embodiments, it is possible to etch the front surface of the substrate appropriately while removing the metal contaminant on the rear surface of the substrate, after thinning the front surface of the substrate.

DETAILED DESCRIPTION

Figure 1:
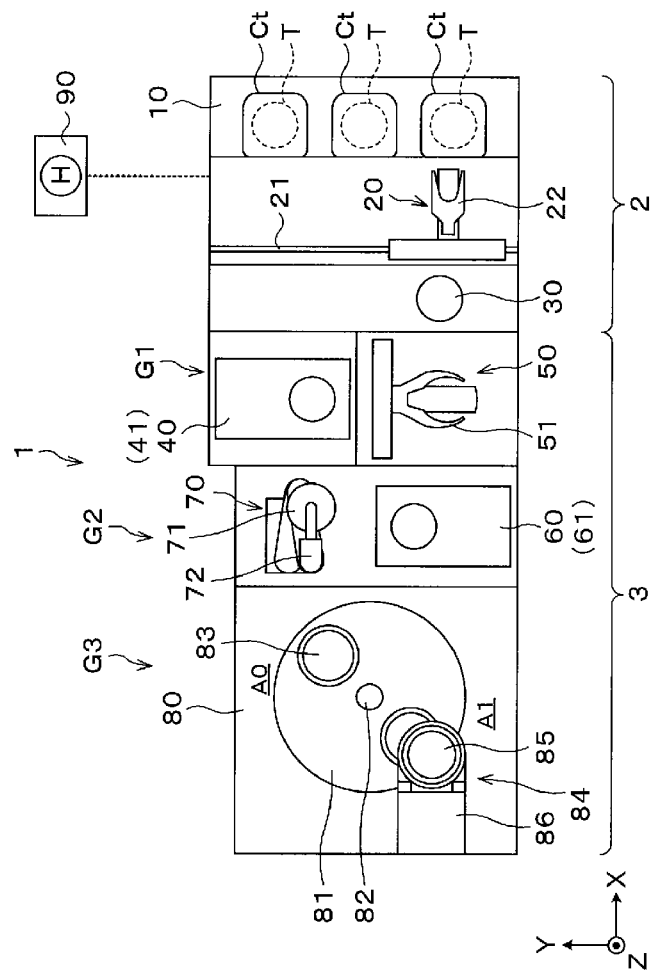
FIG. 1 is a plan view illustrating a schematic configuration of a wafer processing system according to an exemplary embodiment.

In a manufacturing process for a semiconductor device, a semiconductor wafer (hereinafter, simply referred to as "wafer") having a plurality of devices such as electronic circuits on a rear surface thereof is thinned by grinding a front surface of the wafer, as described in Patent Document 1, for example.

If the front surface of the wafer is ground, a damage layer including a crack or a flaw is formed on the front surface of the wafer. Since the damage layer causes a residual stress on the wafer, a flexural strength of a chip formed by, for example, dicing the wafer is weakened, resulting in cracking or breaking of the chip. Thus, a stress relief processing is performed to remove the damage layer. Specifically, as the stress relief processing, an etching processing is performed on the front surface of the wafer by discharging a required chemical liquid onto the front surface of the ground wafer, as disclosed in Patent Document 1, for example.

The grinding of the front surface of the wafer is performed by holding the rear surface of the wafer with a chuck including a metal component such as alumina, and by respectively rotating the wafer (chuck) and a grinding whetstone in the state that the grinding whetstone is in contact with the front surface of the wafer. In this case, since the rear surface of the wafer is held by the chuck including the metal component, the rear surface is contaminated with the metal. In this state, the aforementioned etching processing is performed, and the wafer is accommodated in, for example, a cassette called a FOUP (Front Opening Unified Pod). As a result, the inside of the cassette is contaminated with the metal, having an adverse influence upon a processing to be performed afterwards.

On this ground, the metal contaminant needs to be removed before the wafer after being etched is accommodated in the cassette. However, removing the metal contaminant is not taken into account in conventional methods such as the one disclosed in Patent Document 1, for example.

The present disclosure provides a technique capable of etching, after thinning the front surface of the wafer, the front surface of the wafer appropriately while removing the metal contaminant on the rear surface thereof. Hereinafter, a wafer processing system as a substrate processing apparatus and a wafer processing method as a substrate processing method according to exemplary embodiments will be described with reference to the accompanying drawings. In the present specification and the drawings, parts having the substantially same functions and configurations will be assigned same reference numerals, and redundant description will be omitted.

First, a configuration of a wafer processing system according to a first exemplary embodiment will be described. FIG. 1 is a plan view illustrating a schematic configuration of a wafer processing system 1.

Figure 2:
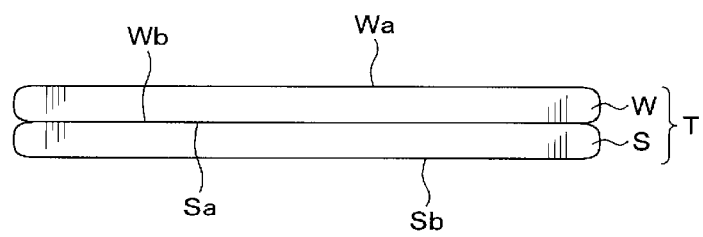
FIG. 2 is a side view illustrating a schematic structure of a combined wafer.
Figure 3:
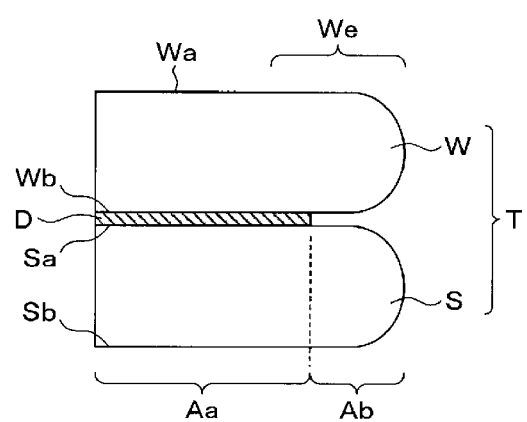
FIG. 3 is a side view illustrating a schematic structure of a part of the combined wafer.

The wafer processing system 1 performs a required processing on a combined wafer T as a combined substrate in which a processing target wafer W as a first substrate and a support wafer S as a second substrate are bonded to each other, as illustrated in FIG. 2 and FIG. 3. Then, in the wafer processing system 1, the processing target wafer W is thinned. Hereinafter, in the processing target wafer W, a surface to be processed (a surface opposite to a surface bonded to the support wafer S) will be referred to as "front surface Wa," and a surface opposite to the front surface Wa will be referred to as "rear surface Wb." Likewise, in the support wafer S, a surface bonded to the processing target wafer W will be referred to as "front surface Sa," and a surface opposite to the front surface Sa will be referred to as "rear surface Sb."

The processing target wafer W is a semiconductor wafer such as, but not limited to, a silicon wafer, and has, on the rear surface Wb thereof, a device layer D including a plurality of devices. Further, an oxide film (not shown), for example, a $SiO_2$ film (TEOS film) is formed on the device layer D. A peripheral portion We of the processing target wafer W is chamfered, and a thickness of the peripheral portion We decreases toward a leading end thereof on a cross section thereof. Here, the peripheral portion We is a portion to be removed by edge trimming and ranges from, e.g., 1 mm to 5 mm from an edge of the processing target wafer W in a diametrical direction thereof.

In FIG. 2, for the sake of simplicity of illustration, illustration of the device layer D is omitted. In the other drawings recited in the following description, illustration of the device layer D may sometimes be omitted as well.

The support wafer S is a wafer configured to support the processing target wafer W, and is, for example, a silicon wafer. An oxide film (not shown) is formed on the front surface Sa of the support wafer S. Further, the support wafer S serves as a protection member which protects the device layer D. Further, if the support wafer S has a plurality of devices on the front surface Sa thereof, a device layer (not shown) is formed on the front surface Sa, the same as in the processing target wafer W.

Here, if the processing target wafer W and the support wafer S are bonded at the peripheral portion We of the processing target wafer W, the peripheral portion We may not be removed appropriately. For the reason, at an interface between the processing target wafer W and the support wafer S, a bonding region Aa where the device layer D and the front surface Sa of the support wafer S are bonded and a non-bonding region Ab are formed. The non-bonding region Ab is located at an outside of the bonding region Aa in the diametrical direction. Since this non-bonding region Ab is provided, the peripheral portion We can be appropriately removed.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. The cassette Ct may be, by way of non-limiting example, a FOUP. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from a carry-in/out station 2 side) toward a negative X-axis side.

The first processing block G1 is equipped with an etching apparatus 40, a cleaning apparatus 41 and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be elongated in the X-axis direction and arranged side by side when viewed from the top. Further, a plurality of etching apparatuses 40 and a plurality of cleaning apparatuses 41 may be respectively stacked on top of each other.

The etching apparatus 40 is configured to etch the front surface Wa of the processing target wafer W grounded by a processing apparatus 80 to be described later. A detailed configuration of the etching apparatus 40 will be described later.

The cleaning apparatus 41 is configured to clean the front surface Wa of the processing target wafer W grounded by the processing apparatus 80 to be described later. By way of example, by bringing a brush into contact with the front surface Wa, the front surface Wa is cleaned by being scrubbed. Furthermore, a pressurized cleaning liquid may be used for the cleaning of the front surface Wa. In addition, the cleaning apparatus 41 may be configured to clean the rear surface Sb of the support wafer S as well as the front surface Wa of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60, a periphery removing apparatus 61 and a wafer transfer device 70. The modifying apparatus 60 and the periphery removing apparatus 61 are stacked on top of each other. Further, the number and the layout of the modifying apparatus 60 and the periphery removing apparatus 61 is not limited to the example of the present exemplary embodiment.

The modifying apparatus 60 is configured to form a peripheral modification layer, a split modification layer and an internal modification layer by radiating laser light to an inside of the processing target wafer W. A specific configuration of the modifying apparatus 60 will be elaborated later.

The periphery removing apparatus 61 is configured to remove the peripheral portion We of the processing target wafer W, starting from the peripheral modification layer formed by the modifying apparatus 60. A specific configuration of the periphery removing apparatus 61 will be elaborated later.

The wafer transfer device 70 is disposed at, for example, a positive Y-axis side of the modifying apparatus 60 and the periphery removing apparatus 61. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. A specific configuration of the transfer arm 71 will be elaborated later. The wafer transfer device 70 is configured to be capable of transferring the combined wafer T to/from the cleaning apparatus 41, the modifying apparatus 60, the periphery removing apparatus 61 and the processing apparatus 80 to be described later.

The third processing block G3 is equipped with the processing apparatus 80 as a processing device. The number and the layout of the processing apparatus 80 is not limited to the example of the present exemplary embodiment, and a plurality of processing apparatuses 80 may be arranged as required.

The processing apparatus 80 is configured to grind the front surface Wa of the processing target wafer W. Further, the processing apparatus 80 is configured to remove, in the front surface Wa having the internal modification layer formed therein, the internal modification layer, and, also, to remove the peripheral modification layer.

The processing apparatus 80 has a rotary table 81. The rotary table 81 is configured to be rotated around a vertical rotation center line 82 by a rotating mechanism (not shown). Two chucks 83 each of which serves as a holder configured to attract and hold the combined wafer T are provided on the rotary table 81. The chucks 83 are uniformly arranged on a circle concentric with the rotary table 81. The chucks 83 are configured to be moved to a delivery position A0 and a processing position A1 as the rotary table 81 is rotated. Further, each of the two chucks 83 is configured to be rotated around a vertical axis by a rotating mechanism (not shown). Additionally, the chucks 83 may include a metal component such as, but not limited to, alumina.

At the delivery position A0, a delivery of the combined wafer T is performed. A grinding unit 84 is disposed at the processing position A1. In the grinding unit 84, the front surface Wa of the processing target wafer W is ground. The grinding unit 84 includes a grinder 85 equipped with a grinding whetstone (not shown) configured to be rotated in a ring shape. The grinding whetstone may include, for example, a metal component. Further, the grinder 85 is configured to be moved vertically along a supporting column 86. By respectively rotating the chuck 83 and the grinding whetstone while keeping the front surface Wa of the processing target wafer W held by the chuck 83 in contact with the grinding whetstone, the front surface Wa is ground.

The above-described wafer processing system 1 is equipped with a control device 90 as a controller. The control device 90 is implemented by, for example, a computer, and includes a program storage (not shown). A program for controlling a processing of the combined wafer T in the wafer processing system 1 is stored in the program storage. Further, the program storage also stores therein a program for implementing a substrate processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Figure 4:
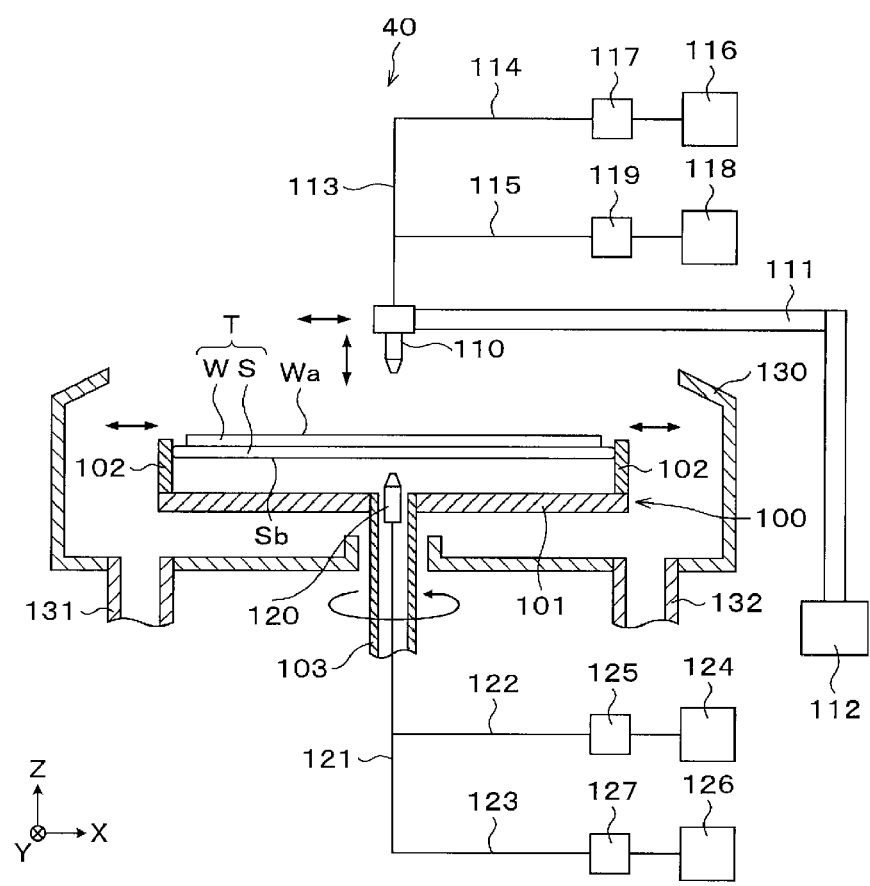
FIG. 4 is a longitudinal cross sectional view illustrating a schematic configuration of an etching apparatus.

Now, the aforementioned etching apparatus 40 will be explained. FIG. 4 is a longitudinal cross sectional view illustrating a schematic configuration of the etching apparatus 40.

Figure 5:
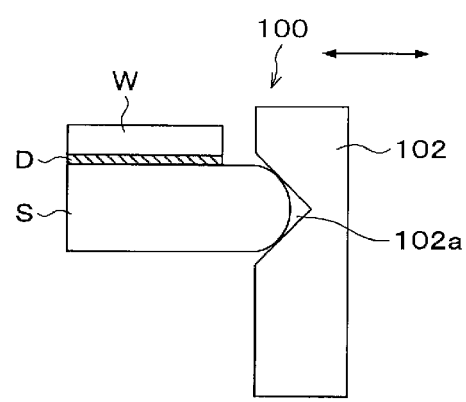
FIG. 5 is a side view illustrating a schematic configuration of a holding mechanism.

The etching apparatus 40 is equipped with a holding mechanism 100 configured to hold the combined wafer T. The holding mechanism 100 includes a substantially disk-shaped base 101 having a diameter larger than a diameter of the combined wafer T; and a plurality of holding members 102 provided at a peripheral portion of the base 101. As shown in FIG. 5, each holding member 102 has, on a side surface thereof, a recess 102a into which an edge portion of the support wafer S is to be fitted. As illustrated in FIG. 4, the support wafer S of the combined wafer T is held by the plurality of holding members 102. Further, each holding member 102 is configured to be moved in the horizontal direction by a moving mechanism (not shown).

A rotating mechanism 103 is provided at a central portion of the base 101. The rotating mechanism 103 is connected to a rotation driving unit (not shown), and the base 101 and the combined wafer T held on the base 101 can be rotated by the rotating mechanism 103. Further, the rotating mechanism 103 is hollow.

A first nozzle 110 is provided above the base 101. The first nozzle 110 is supported at a nozzle arm 111, and the nozzle arm 111 is provided with a moving mechanism 112. The first nozzle 110 is configured to be rotated and moved in the vertical direction by the moving mechanism 112.

Connected to the first nozzle 110 is a supply line 113 through which an etching liquid as a first processing liquid and a rinse liquid are supplied onto the front surface Wa of the processing target wafer W. The supply line 113 is branched into an etching liquid supply line 114 and a rinse liquid supply line 115 at an opposite side from the first nozzle 110.

The etching liquid supply line 114 is connected to an etching liquid source 116 storing the etching liquid therein. By way of non-limiting example, a nitrohydrofluoric acid-based liquid such HF or HNO$_3$ may be used as the etching liquid. Further, the etching liquid supply line 114 is provided with a valve 117 configured to control a supply of the etching liquid. The front surface Wa of the processing target wafer W is etched by this etching liquid. Further, a metal contaminant on the front surface Wa of the processing target wafer W is removed by this etching liquid.

The rinse liquid supply line 115 is connected to a rinse liquid source 118 storing therein the rinse liquid, for example, pure water. Further, the rinse liquid supply line 115 is provided with a valve 119 configured to control a supply of the rinse liquid. Further, a nozzle for supplying the rinse liquid may be provided separately from the first nozzle 110.

A second nozzle 120 is provided under the base 101. This second nozzle 120 is protruded from the hollow rotating mechanism 103.

Connected to the second nozzle 120 is a supply line 121 through which a cleaning liquid as a second processing liquid and a rinse liquid are supplied to the rear surface Sb of the support wafer S. The supply line 121 is inserted into the rotating mechanism 103 to penetrate it, and branched into a cleaning liquid supply line 122 and a rinse liquid supply line 123 at an opposite side from the second nozzle 120.

The cleaning liquid supply line 122 is connected to a cleaning liquid source 124 storing the cleaning liquid therein. Byway of non-limiting example, FPM (a mixed aqueous solution of hydrofluoric acid and hydrogen peroxide), SC2 (a mixed aqueous solution of hydrochloric acid and hydrogen peroxide), or the like may be used as the cleaning liquid. Further, the cleaning liquid supply line 122 is provided with a valve 125 configured to control a supply of the cleaning liquid. A metal contaminant on the rear surface Sb of the support wafer S is removed by this cleaning liquid.

The rinse liquid supply line 123 is connected to a rinse liquid source 126 storing therein the rinse liquid, for example, pure water. Further, the rinse liquid supply line 123 is provided with a valve 127 configured to control a supply of the rinse liquid. Furthermore, a nozzle for supplying the rinse liquid may be provided separately from the second nozzle 120.

A cup 130 is disposed around the holding mechanism 100 to receive and collect the liquid(s) scattered or falling from the combined wafer T. A drain line 131 for draining the collected liquid(s) and an exhaust line 132 for exhausting an atmosphere within the cup 130 to evacuate the cup to a vacuum are connected to a bottom of the cup 130.

Figure 6:
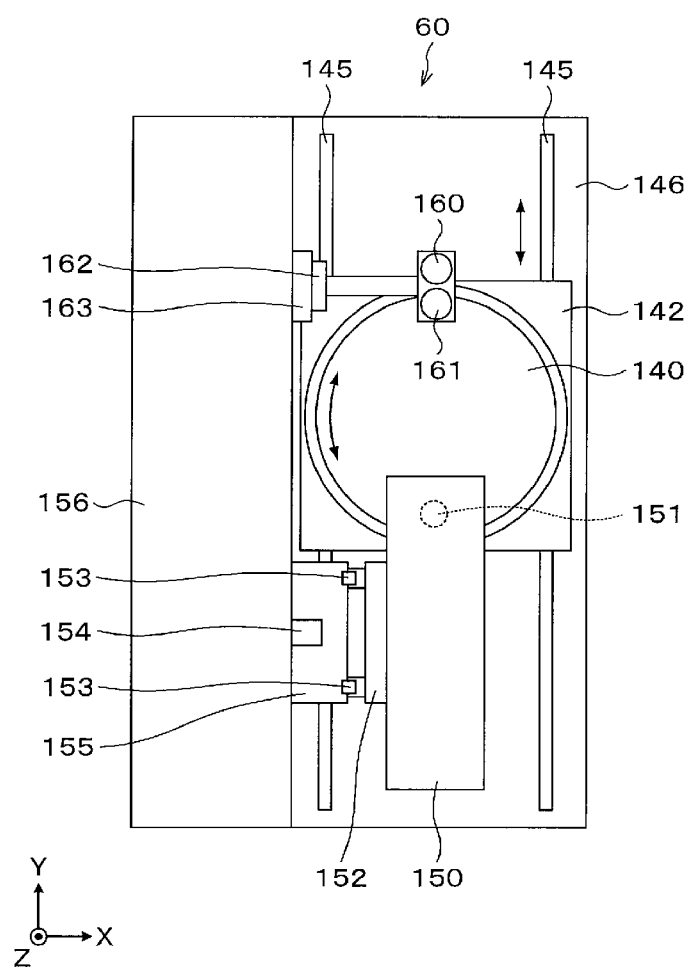
FIG. 6 is a plan view illustrating a schematic configuration of a modifying apparatus.
Figure 7:
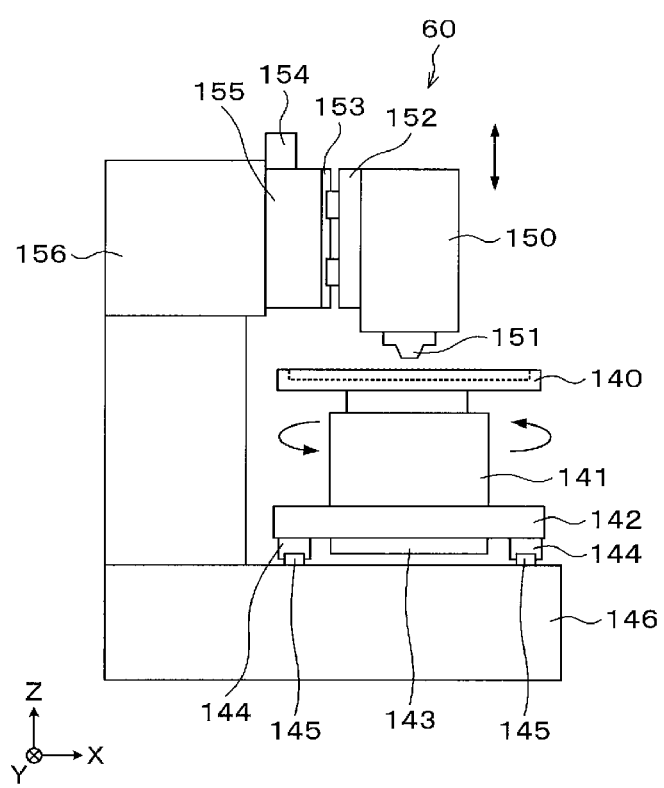
FIG. 7 is a side view illustrating a schematic configuration of the modifying apparatus.

Now, the aforementioned modifying apparatus 60 will be described. FIG. 6 is a plan view illustrating a schematic configuration of the modifying apparatus 60. FIG. 7 is a side view illustrating the schematic configuration of the modifying apparatus 60.

The modifying apparatus 60 is equipped with a chuck 140 as a holder configured to hold the combined wafer T on a top surface thereof. The chuck 140 is configured to attract and hold the support wafer S in the state that the processing target wafer W is placed at an upper side and the support wafer S is placed at a lower side. The chuck 140 includes a metal component such as, but not limited to, alumina. The chuck 140 is supported on a slider table 142 with an air bearing 141 therebetween. A rotating mechanism 143 is provided at a bottom surface side of the slider table 142. The rotating mechanism 143 incorporates therein, for example, a motor as a driving source. The chuck 140 is configured to be rotated around a vertical axis by the rotating mechanism 143 via the air bearing 141 therebetween. The slider table 142 is configured to be moved by a moving mechanism 144, which is provided at a bottom surface side thereof, along a rail 145 which is provided on a base 146 and elongated in the Y-axis direction. Further, though not particularly limited, a driving source of the moving mechanism 144 may be, for example, a linear motor.

A laser head 150 as a modifying device is provided above the chuck 140. The laser head 150 has a lens 151. The lens 151 is a cylindrical member provided on a bottom surface of the laser head 150, and is configured to radiate the laser light to the processing target wafer W held by the chuck 140.

The laser head 150 concentrates and radiates the laser light having a wavelength featuring transmissivity for the processing target wafer W to a required position within the processing target wafer W as high-frequency laser light in a pulse shape outputted from a laser light oscillator (not shown). Accordingly, a portion within the processing target wafer W to which the laser light is concentrated is modified, so that a peripheral modification layer, a split modification layer and an internal modification layer are formed.

The laser head 150 is supported at a supporting member 152. The laser head 150 is configured to be moved up and down by an elevating mechanism 154 along a vertically elongated rail 153. Further, the laser head 150 is configured to be moved in the Y-axis direction by a moving mechanism 155. Further, each of the elevating mechanism 154 and the moving mechanism 155 is supported at a supporting column 156.

Above the chuck 140, a macro-camera 160 and a micro-camera 161 are provided at a positive Y-axis side of the laser head 150. For example, the macro-camera 160 and the micro-camera 161 are formed as one body, and the macro-camera 160 is provided at a positive Y-axis side of the micro-camera 161. The macro-camera 160 and the micro-camera 161 are configured to be moved up and down by an elevating mechanism 162, and also configured to be moved in the Y-axis direction by a moving mechanism 163.

The macro-camera 160 images an outer end portion of the processing target wafer W (combined wafer T). The macro-camera 160 is equipped with, for example, a coaxial lens, and radiates visible light, for example, red light and receives reflection light from a target object. For example, the macro-camera 160 has an image magnification of two times.

The micro-camera 161 images a peripheral portion of the processing target wafer W and also images a boundary between the bonding region Aa and the non-bonding region Ab. The micro-camera 161 is equipped with, for example, a coaxial lens, and radiates infrared light (IR light) and receives reflection light from a target object. By way of example, the micro-camera 161 has an image magnification of 10 times. A field of view of the micro-camera 161 is about ⅕ of a field of view of the macro-camera 160, and a pixel size of the micro-camera 161 is about ⅕ of a pixel size of the macro-camera 160.

Figure 8:
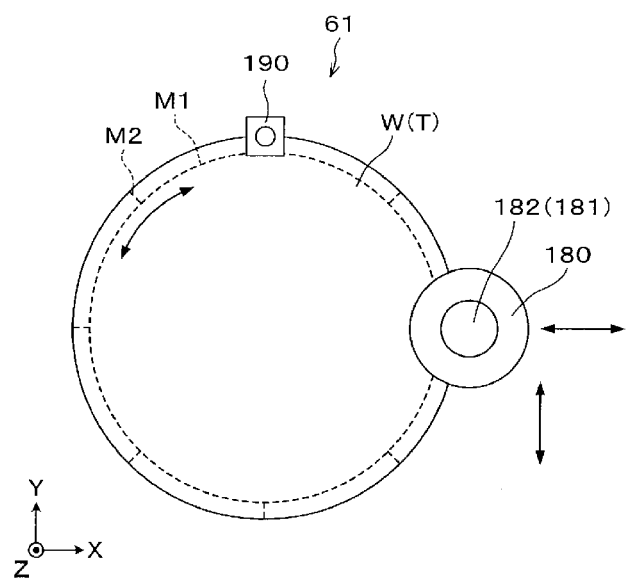
FIG. 8 is a plan view illustrating a schematic configuration of a periphery removing apparatus.
Figure 9:
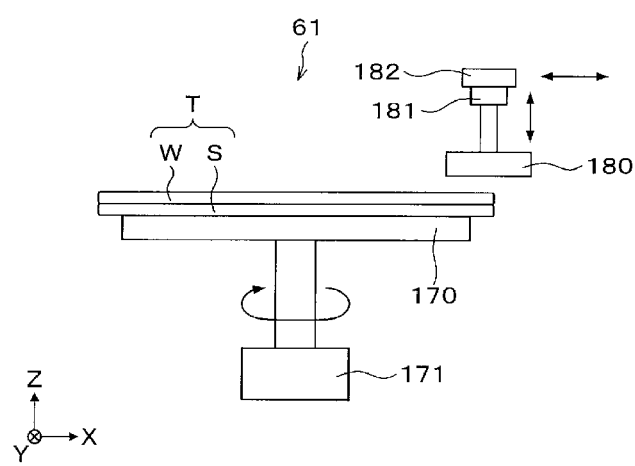
FIG. 9 is a side view illustrating the schematic configuration of the periphery removing apparatus.

Now, the aforementioned periphery removing apparatus 61 will be explained. FIG. 8 is a plan view illustrating a schematic configuration of the periphery removing apparatus 61. FIG. 9 is a side view illustrating the schematic configuration of the periphery removing apparatus 61.

The periphery removing apparatus 61 is equipped with a chuck 170 configured to hold the combined wafer T on a top surface thereof. The chuck 170 is configured to attract and hold the support wafer S in the state that the processing target wafer W is placed at an upper side and the support wafer S is placed at a lower side. Further, the chuck 170 is configured to be rotated around a vertical axis by a rotating mechanism 171.

Provided above the chuck 170 is a pad 180 configured to transfer the processing target wafer W while holding the peripheral portion We thereof. The pad 180 is connected with a suction mechanism (not shown) such as, but not limited to, a vacuum pump, and the pad 180 is configured to attract and hold the peripheral portion We on a bottom surface thereof. The pad 180 is equipped with an elevating mechanism 181 configured to move the pad 180 in a vertical direction and a moving mechanism 182 configured to move the pad 180 in horizontal directions (the X-axis direction and the Y-axis direction).

A detector 190 is provided above the chuck 170 to detect whether the peripheral portion We is removed from the processing target wafer W. The detector 190 detects presence or absence of the peripheral portion We in the processing target wafer W which is held by the chuck 170 and from which the peripheral portion We is removed. By way of example, a sensor may be used as the detector 190. The sensor may be, by way of non-limiting example, a line type laser displacement meter, and it detects the presence or absence of the peripheral portion We by radiating laser to the peripheral portion of the combined wafer T (processing target wafer W) and measuring a thickness of the combined wafer T. However, the way how to detect the presence or absence of the peripheral portion We by the detector 190 is not limited thereto. For example, the detector 190 may detect the presence or absence of the peripheral portion We by imaging the combined wafer T (processing target wafer W) with, for example, a line camera.

Further, a collector (not shown) configured to collect the peripheral portion We transferred by the pad 180 is provided under the chuck 170. The collector receives and collects the peripheral portion We attracted to and held by the pad 180.

Figure 10:
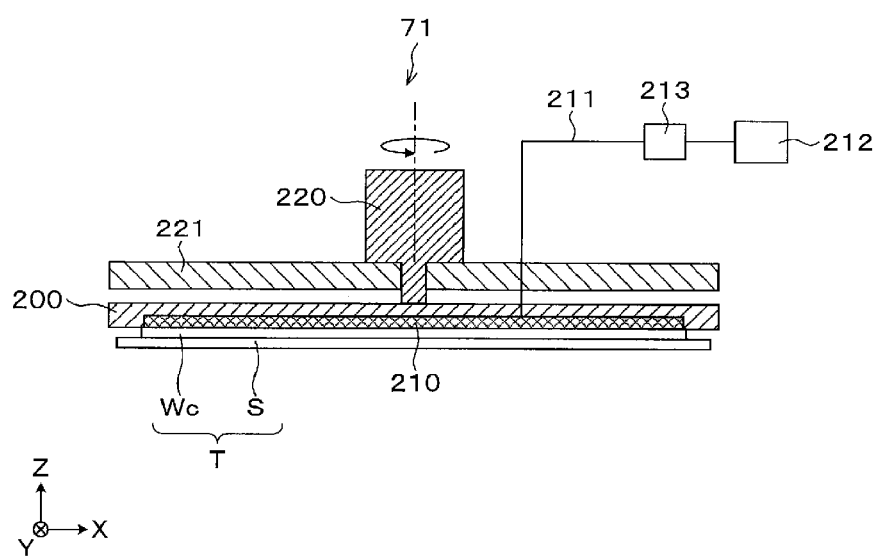
FIG. 10 is a longitudinal cross sectional view illustrating a schematic configuration of a transfer arm.

Now, the transfer arm 71 of the aforementioned wafer transfer device 70 as a separating device will be described. FIG. 10 is a longitudinal cross sectional view illustrating a schematic configuration of the transfer arm 71.

The transfer arm 71 is equipped with a circular attraction plate 200 having a diameter larger than a diameter of the combined wafer T. A holder 210 configured to hold the central portion We of the processing target wafer W is provided in a bottom surface of the attraction plate 200.

A suction line 211 for suctioning the central portion We is connected to the holder 210, and the suction line 211 is connected to a suction mechanism 212 such as, but not limited to, a vacuum pump. The suction line 211 is provided with a pressure sensor 213 configured to measure a suction pressure. Though a configuration of the pressure sensor 213 is not particularly limited, a diaphragm pressure sensor may be used.

A rotating mechanism 220 configured to rotate the attraction plate 200 around a vertical axis is provided on a top surface of the attraction plate 200. The rotating mechanism 220 is supported at a supporting member 221. Further, the supporting member 221 (rotating mechanism 220) is supported at the arm member 72.

Figure 11:
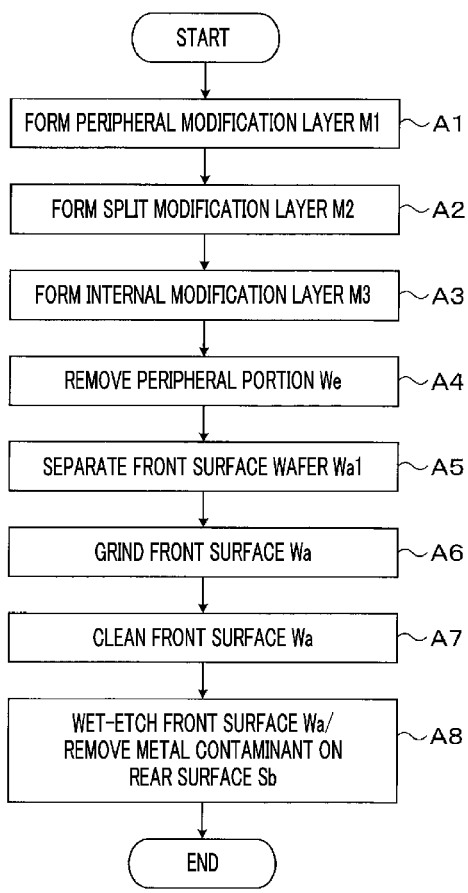
FIG. 11 is a flowchart illustrating main processes of a wafer processing according to a first exemplary embodiment.

Now, a wafer processing performed by using the wafer processing system 1 configured as described above will be discussed. FIG. 11 is a flowchart illustrating main processes of the wafer processing. FIG. 12A to FIG. 12F are explanatory diagrams illustrating the main processes of the wafer processing. In the present exemplary embodiment, the combined wafer T is previously formed by bonding the processing target wafer W and the support wafer S in a bonding apparatus (not shown) at the outside of the wafer processing system 1.

Figure 12A:
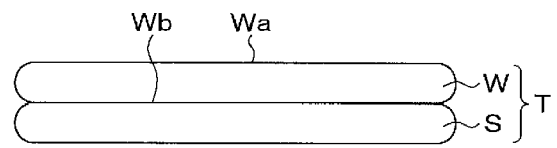
FIG. 12A to FIG. 12F are explanatory diagrams illustrating the main processes of the wafer processing according to the first exemplary embodiment.

First, the cassette Ct accommodating therein the multiple number of combined wafers T shown in FIG. 12A is placed on the cassette placing table 10 of the carry-in/out station 2.

Figure 12B:
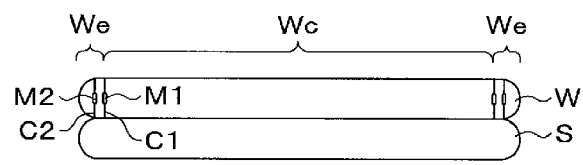
Figure 12C:
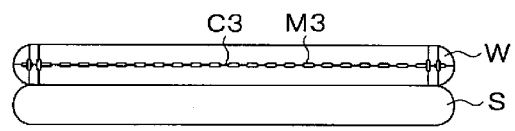

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, a peripheral modification layer M1 and a split modification layer M2 are formed inside the processing target wafer W in sequence as illustrated in FIG. 12B (processes A1 and A2 of FIG. 11), and, also, an internal modification layer M3 is formed as illustrated in FIG. 12C (process A3 of FIG. 11). The peripheral modification layer M1 serves as a starting point when the peripheral portion We is removed in the edge trimming. The split modification layer M2 serves as a starting point when the peripheral portion We to be removed is broken into smaller pieces. The internal modification layer M3 serves as a starting point for thinning the processing target wafer W.

First, the combined wafer T is transferred by the wafer transfer device 50 and held on the chuck 140. Then, the chuck 140 is moved to a macro-alignment position. The macro-alignment position is a position where the macro-camera 160 is capable of imaging the outer end portion of the processing target wafer W.

Thereafter, the outer end portion of the processing target wafer W is imaged by the macro-camera 160 in 360 degrees in a circumferential direction of the processing target wafer W. The obtained image is outputted to the control device 90 from the macro-camera 160.

In the control device 90, a first eccentric amount between a center Cc of the chuck 140 and a center Cw of the processing target wafer W is calculated from the image obtained by the macro-camera 160. Further, in the control device 90, a moving amount of the chuck 140 is calculated based on the first eccentric amount to correct a Y-axis component of the first eccentric amount. The chuck 140 is moved in the Y-axis direction based on the calculated moving amount, and then moved to a micro-alignment position. The micro-alignment position is a position where the micro-camera 161 is capable of imaging the peripheral portion of the processing target wafer W. Here, the field of view of the micro-camera 161 is smaller (about ⅕) than the field of view of the macro-camera 160, as stated above. Thus, if the Y-axis component of the first eccentric amount is not corrected, the peripheral portion of the processing target wafer W may not be included in an angle of view of the micro-camera 161, resulting in a failure to image the peripheral portion of the processing target wafer W with the micro-camera 161. For the reason, the correction of the Y-axis component based on the first eccentric amount is performed to move the chuck 140 to the micro-alignment position.

Subsequently, the boundary between the bonding region Aa and the non-bonding region Ab is imaged by the micro-camera 161 in 360 degrees in the circumferential direction of the processing target wafer W. The obtained image is outputted to the control device 90 from the micro-camera 161.

In the control device 90, a second eccentric amount between the center Cc of the chuck 140 and a center Ca of the bonding region Aa is calculated from the image obtained by the micro-camera 161. Further, in the control device 90, the position of the chuck 140 with respect to the peripheral modification layer M1 is decided based on the second eccentric amount such that the center of the chuck 140 and the center of the bonding region Aa are coincident with each other.

Figure 13:
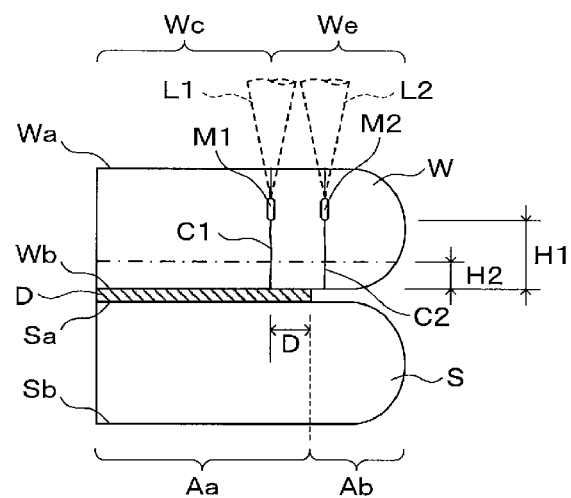
FIG. 13 is an explanatory diagram illustrating a state in which a peripheral modification layer and a split modification layer are being formed in a processing target wafer.
Figure 14:
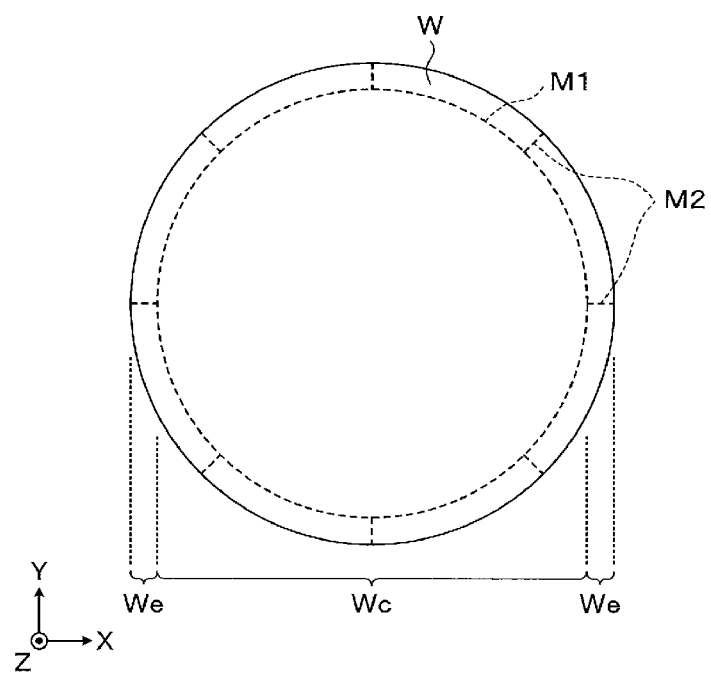
FIG. 14 is an explanatory diagram illustrating a state in which the peripheral modification layer and the split modification layer are formed in the processing target wafer.

Thereafter, as illustrated in FIG. 13 and FIG. 14, by radiating laser light L1 (laser light L1 for periphery) from the laser head 150, the peripheral modification layer M1 is formed at the boundary between the peripheral portion We and the central portion Wc of the processing target wafer W (process A1 of FIG. 11). Further, the peripheral modification layer M1 is formed at an inner side than an outer end portion of the bonding region Aa in the diametrical direction.

The peripheral modification layer M1 formed by the laser light L1 is elongated in a thickness direction and has an aspect ratio with a vertically longer side. A lower end of the peripheral modification layer M1 is located above a target surface (indicated by a dashed line in FIG. 13) of the processing target wafer W after being thinned. That is, a distance H1 between the lower end of the peripheral modification layer M1 and the rear surface Wb of the processing target wafer W is larger than a target thickness H2 of the processing target wafer W after being thinned. In this case, the peripheral modification layer M1 does not remain in the processing target wafer W after being thinned. Further, within the processing target wafer W, a crack C1 develops from the peripheral modification layer M1, and reaches the front surface Wa and the rear surface Wb.

In the process A1, to locate the chuck 140 at the position decided by the control device 90, the chuck 140 is rotated by the rotating mechanism 143 and moved in the Y-axis direction by the moving mechanism 144 such that the center of the bonding region Aa and the center of the chuck 140 are coincident with each other. At this time, the rotating of the chuck 140 and the moving of the chuck 140 in the Y-axis direction are synchronized.

While rotating and moving the chuck 140 (processing target wafer W) as described above, the laser light L1 is radiated to the inside of the processing target wafer W from the laser head 150. That is, while correcting the second eccentric amount, the peripheral modification layer M1 is formed. The peripheral modification layer M1 is formed in a ring shape to be concentric with the bonding region Aa. That is, a distance D between the peripheral modification layer M1 and the outer end portion of the bonding region Aa shown in FIG. 13 can be made constant. Thus, in the periphery removing apparatus 61, the peripheral portion We can be appropriately removed, starting from the peripheral modification layer M1.

Further, in the present exemplary embodiment, if the second eccentric amount includes an X-axis component, this X-axis component is corrected by rotating the chuck 140 while moving it in the Y-axis direction. Meanwhile, if the second eccentric amount does not include the X-axis component, the chuck 140 only needs to be moved in the Y-axis direction without being rotated.

Thereafter, the laser head 150 is moved in the Y-axis direction, and by radiating laser light L2 (laser light L2 for split) from the laser head 150, the split modification layer M2 is formed at an outer side than the peripheral modification layer M1 in the diametrical direction (process A2 of FIG. 11), as illustrated in FIG. 13 and FIG. 14.

The split modification layer M2 is elongated in the thickness direction and has an aspect ratio with a vertically longer side, the same as the peripheral modification layer M1. Further, in the present exemplary embodiment, the split modification layer M2 is formed on a level with the peripheral modification layer M1. In addition, a crack C2 develops from the split modification layer M2 and reaches the front surface Wa and the rear surface Wb.

Furthermore, by forming multiple split modification layers M2 and cracks C2 at a pitch of several micrometers (μm) in the diametrical direction, a single line-shaped split modification layer M2 elongated outwards from the peripheral modification layer M1 in the diametrical direction is formed, as shown in FIG. 14. Further, in the shown example, the line-shaped split modification layer M2 elongated in the diametrical direction is formed at eight different positions.

However, the number of the split modification layers M2 is not particularly limited. As long as the split modification layers M2 are formed at two different positions at least, the peripheral portion We can be removed. In this case, when removing the peripheral portion We in the edge trimming, this peripheral portion is separated starting from the ring-shaped peripheral modification layer M1 to be split into multiple pieces by the split modification layers M2. Accordingly, the peripheral portion We to be removed is broken into smaller pieces, and thus can be removed more easily. Further, this removing of the peripheral portion We (so-called edge trimming) is performed to suppress the peripheral portion We of the processing target wafer W after being ground from being given a sharp pointed shape (so-called knife edge shape).

Moreover, though the laser head 150 is moved in the Y-axis direction to form the split modification layer M2 in the present exemplary embodiment, the chuck 140 may be moved in the Y-axis direction instead.

Figure 15:
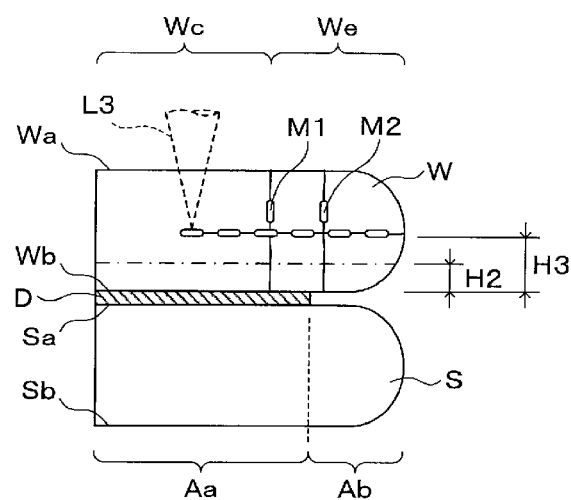
FIG. 15 is an explanatory diagram illustrating a state in which an internal modification layer is being formed in the processing target wafer.
Figure 16:
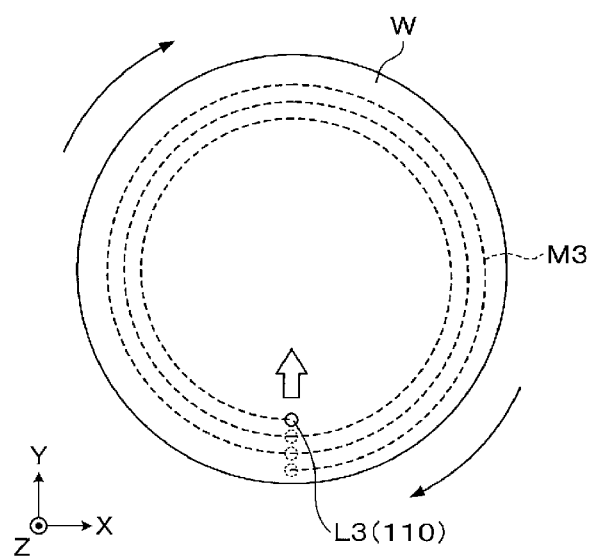
FIG. 16 is an explanatory diagram illustrating a state in which the internal modification layer is being formed in the processing target wafer.

Subsequently, as depicted in FIG. 15 and FIG. 16, by radiating laser light L3 (laser light L3 for internal surface) from the laser head 150, the internal modification layer M3 is formed along a plane direction of the processing target wafer W (process A3 of FIG. 11). Black arrows shown in FIG. 16 indicate a rotation direction of the chuck 140, the same as in the following description.

A lower end of the internal modification layer M3 is located above the target surface (indicated by a dashed line in FIG. 15) of the processing target wafer W after being thinned. That is, a distance H3 between the lower end of the internal modification layer M3 and the rear surface Wb of the processing target wafer W is slightly larger than the target thickness H2 of the processing target wafer W after being thinned. Within the processing target wafer W, a crack C3 develops from the internal modification layer M3 along the plane direction.

In the process A3, while rotating the chuck 140 (processing target wafer W) and moving the laser head 150 in the Y-axis direction from the peripheral portion of the processing target wafer W toward the central portion thereof, the laser light L3 is radiated from the laser head 150 to the inside of the processing target wafer W. As a result, the internal modification layer M3 is formed in a spiral shape from an outer side to an inner side within the surface of the processing target wafer W.

Further, though the laser head 150 is moved in the Y-axis direction to form the internal modification layer M3 in the present exemplary embodiment, the chuck 140 may be moved in the Y-axis direction instead. Further, though the chuck 140 is rotated to form the internal modification layer M3, the laser head 150 may be moved and rotated relative to the chuck 140 instead.

If the internal modification layer M3 is formed within the processing target wafer W, the combined wafer T is taken out by the wafer transfer device 70.

Figure 12D:
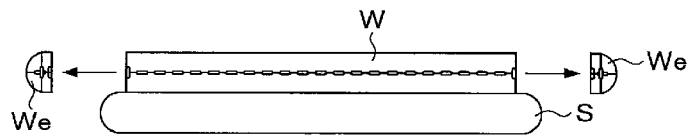

Then, the combined wafer T is transferred into the periphery removing apparatus 61 by the wafer transfer device 70. In the periphery removing apparatus 61, the peripheral portion We of the processing target wafer W is removed starting from the peripheral modification layer M1 (process A4 of FIG. 11), as illustrated in FIG. 12D. In the process A4, the pad 180 is lowered by the elevating mechanism 181 to attract and hold the peripheral portion We, and, then, the pad 180 is raised. As a result, the peripheral portion We held by the pad 180 is separated from the processing target wafer W, starting from the peripheral modification layer M1. At this time, the peripheral portion We is separated while being broken into smaller pieces starting from the split modification layers M2. Further, the removed peripheral portion We is collected from the pad 180 into the collector (not shown).

Figure 12E:
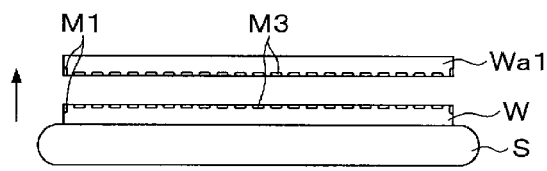

Thereafter, the combined wafer T is transferred into the processing apparatus 80 by the wafer transfer device 70. In the processing apparatus 80, the combined wafer T is delivered from the transfer ram 71 onto the chuck 83 located at the delivery position A0. At this time, the front surface Wa side of the processing target wafer W (hereinafter, referred to as "front surface wafer Wa1") is separated starting from the internal modification layer M3 (process A5 of FIG. 11), as illustrated in FIG. 12E.

In the process A5, the support wafer S is attracted to and held by the chuck 83 while the processing target wafer W is attracted to and held by the attraction plate 200 of the transfer arm 71. Then, the attraction plate 200 is rotated, and the front surface wafer Wa1 is cut along the internal modification layer M3. Thereafter, the attraction plate 200 is raised in the state that the front surface wafer Wa1 is attracted to and held by the attraction plate 200, so that the front surface wafer Wa1 is separated from the processing target wafer W. At this time, by measuring a pressure for suctioning the front surface wafer Wa1 with the pressure sensor 213, presence or absence of the front surface wafer Wa1 is detected. Thus, it can be checked whether the front surface wafer Wa1 is separated from the processing target wafer W. Further, the separated front surface wafer Wa1 is collected to the outside of the wafer processing system 1.

Figure 12F:
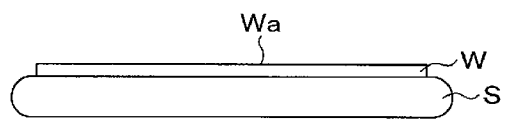

Subsequently, the chuck 83 is moved to the processing position A1. Then, as shown in FIG. 12F, the front surface Wa of the processing target wafer W held by the chuck 83 is ground by the grinding unit 84, and the internal modification layer M3 and the peripheral modification layer M1 left on the front surface Wa are removed (process A6 of FIG. 11). In the process A6, by respectively rotating the processing target wafer W and the grinding whetstone in the state that the front surface Wa is in contact with the grinding whetstone, the front surface Wa is ground. Further, the front surface Wa of the processing target wafer W may be then cleaned by a cleaning liquid, using a cleaning liquid nozzle (not shown).

Thereafter, the combined wafer T is transferred to the cleaning apparatus 41 by the wafer transfer device 70. In the cleaning apparatus 41, the ground front surface Wa of the processing target wafer W is scrub-cleaned (process A7 of FIG. 11). Further, in the cleaning apparatus 41, the rear surface Sb of the support wafer S as well as the front surface Wa of the processing target wafer W may be cleaned.

Afterwards, the combined wafer T is transferred to the etching apparatus 40 by the wafer transfer device 50. In the etching apparatus 40, the front surface Wa of the processing target wafer W is etched, and a metal contaminant on the rear surface Sb of the support wafer S is removed (process A8 of FIG. 11). In the process A8, the combined wafer T is first delivered to the holding mechanism 100 from the wafer transfer device 50 and held thereby.

Then, an etching liquid E1 is supplied onto the front surface Wa of the processing target wafer W from the first nozzle 110 while rotating the combined wafer T held by the holding mechanism 100 with the rotating mechanism 103. Accordingly, the front surface Wa of the processing target wafer W is etched by the etching liquid E1. A damage layer is formed on the front surface Wa grounded by the aforementioned processing apparatus 80. By wet-etching the front surface Wa, however, the damage layer is removed, so that a stress can be removed and the front surface Wa can be flattened. Here, since the rear surface Sb of the support wafer S is held by the chuck 83 including the metal component when the front surface Wa is ground by the aforementioned processing apparatus 80, a residue of the metal may be generated and attached to the front surface Wa. Further, since the front surface Wa is ground with the grinding whetstone including the metal component, the metal may adhere to the front surface Wa. Furthermore, in the modifying apparatus 60 as well, since the rear surface Sb of the support wafer S is held by the chuck 140 including the metal component, a residue of the metal may be generated and attached to the front surface Wa. These metal contaminants on the front surface Wa of the processing target wafer W, however, can be removed by the etching liquid E1.

Further, while supplying the etching liquid E1 onto the front surface Wa of the processing target wafer W from the first nozzle 110, a cleaning liquid E2 is concurrently supplied onto the rear surface Sb of the support wafer S from the second nozzle 120. Since the rear surface Sb is held by the chuck 83 including the metal component when the front surface Wa is ground by the processing apparatus 80 as stated above, the rear surface Sb may be contaminated with the metal. Moreover, in the modifying apparatus 60, since the rear surface Sb of the support wafer S is held by the chuck 140 including the metal component, the rear surface Sb may be contaminated with the metal as well. These metal contaminants on the rear surface Sb of the support wafer S, however, can be removed by the cleaning liquid E2.

Figure 17:
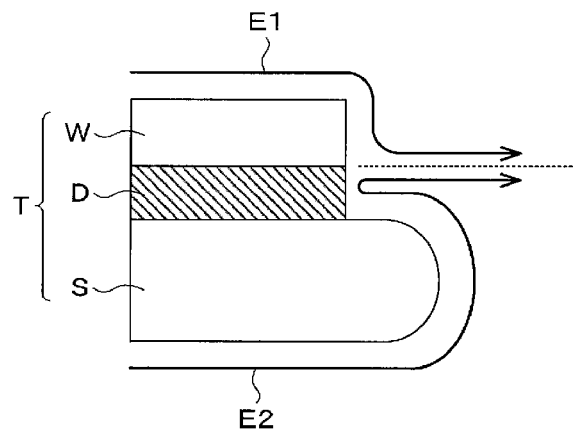
FIG. 17 is an explanatory diagram illustrating flows of an etching liquid and a cleaning liquid in the etching apparatus.

At this time, it is desirable that, at a lateral side of the combined wafer T, the etching liquid E1 does not reach the device layer D while the cleaning liquid E2 reaches the device layer D, as shown in FIG. 17. To be specific, a supply amount of the cleaning liquid E2 supplied from the second nozzle 120 may be set to be larger than a supply amount of the etching liquid E1 supplied from the first nozzle 110. In this case, the device layer D can be suppressed from being etched by the etching liquid E1, so that the device layer D can be protected.

Further, in the present exemplary embodiment, a time during which the etching of the front surface Wa by the etching liquid E1 is performed and a time during which the removing of the metal contaminant on the rear surface Sb by the cleaning liquid E2 is performed are set to be same. Specifically, by adjusting, for example, concentrations and temperatures of the etching liquid E1 and the cleaning liquid E2, the aforementioned times are adjusted. Further, a time when the etching of the front surface Wa is begun and a time when the removing of the metal contaminant of the rear surface Sb is begun are set to be same, and a time when the etching of the front surface Wa is ended and a time when the removing of the metal contaminant of the rear surface Sb is ended are set to be same.

Upon the completion of the etching of the front surface Wa and the removing of the metal contaminant of the rear surface Sb, the rinse liquid is supplied onto the front surface Wa from the first nozzle 110 and onto the rear surface Sb from the second nozzle 120 in the state that the rotation of the combined wafer T by the rotating mechanism 103 is carried on. Then, the rinsing of the front surface Wa and the rinsing of the rear surface Sb are performed at the same time. Thereafter, by carrying on the rotation of the combined wafer T by the rotating mechanism 103, the rinse liquid is scattered off, and the combined wafer T is dried.

Thereafter, the combined wafer T after being subjected to all the required processings is transferred to the transition device 30 by the wafer transfer device 50, and then transferred into the cassette Ct on the cassette placing table 10 by the wafer transfer device 20. Accordingly, the series of processes of the wafer processing in the wafer processing system 1 are ended.

According to the above-described exemplary embodiment, the etching of the front surface Wa of the processing target wafer W by the etching liquid E1 and the removing of the metal contaminant on the rear surface Sb of the support wafer S by the cleaning liquid E2 are performed in the process A8. Thus, the combined wafer T after being subjected to the process A8 can be returned to the cassette C in the clean state. As a result, contamination of the inside of the cassette Ct with the metal can be suppressed, and a subsequent processing can be performed appropriately. Further, a troublesome work of replacing the cassette Ct or the like is not required.

Conventionally, since the combined wafer T is returned back into the cassette Ct after the etching of the front surface Wa is performed and, also, since the cleaning of the combined wafer T is performed at an outside of the wafer processing system 1, a throughput of the wafer processing has been low. In the present exemplary embodiment, however, since the removing of the metal contaminant of the rear surface Sb as well as the etching of the front surface Wa is performed in the etching apparatus 40, a throughput of the wafer processing can be improved.

Further, in the process A8, since the etching by the etching liquid E1 and the removing of the metal contaminant by the cleaning liquid E2 are performed at the same time, the throughput of the wafer processing can be further improved. Here, however, the etching and the removing of the metal contaminant need not be performed at the same time, but they may be performed one after another, for example.

In addition, in the process A8, since the etching by the etching liquid E1 and the removing of the metal contaminant by the cleaning liquid E2 are ended at the same time, the rinsing processing afterwards can be performed all at once. Accordingly, the throughput of the wafer processing can be further improved.

Moreover, in the above-described exemplary embodiment, the time when the etching ends and the time when the removing of the metal contaminant ends are set to be same by setting the etching time during which the etching by the etching liquid E1 is performed and the metal contaminant removing time during which the removing of the metal contaminant by the cleaning liquid E2 is performed to be same. However, the etching time and the metal contaminant removing time may be set to be different. In such a case, by delaying the times when the etching and the removing of the metal contaminant are begun, the times when these processes end can be made same. To be specific, a time for starting the supply of the cleaning liquid E2 from the second nozzle 120 may be controlled in consideration of the etching time. By fixing the etching time in this way, over-etching of the front surface Wa can be suppressed.

In the above-described exemplary embodiment, the nitro-hydrofluoric acid-based liquid such HF or $HNO_3$, that is, an acidic etching liquid is used as the etching liquid E1. However, an alkaline etching liquid such as, but not limited to, TMAH, choline, or KOH may be used instead. Selection of the acidic etching liquid or the alkaline etching liquid is made in consideration of how much the front surface Wa of the processing target wafer W needs to be etched.

By way of example, if a target etching height of the front surface Wa is sufficiently higher than a top surface of the device layer D, it is recommended to use the acidic etching liquid only, as in the above-described exemplary embodiment. Since the acidic etching liquid has a high etching rate, a time required for the etching can be shortened.

Meanwhile, if the target etching height of the front surface Wa is close to the top surface of the device layer D, it may be possible to use the acidic etching liquid first and then to change to the alkaline etching liquid. If the front surface Wa is etched by using the acidic etching liquid only, there is a concern that the front surface Wa may be over-etched and the device layer D may be etched as the etching rate is high. As a resolution, by continuing the etching of the front surface Wa with the alkaline etching liquid after etching the front surface Wa with the acidic etching liquid to some extent, such over-etching can be avoided.

Figure 18A:
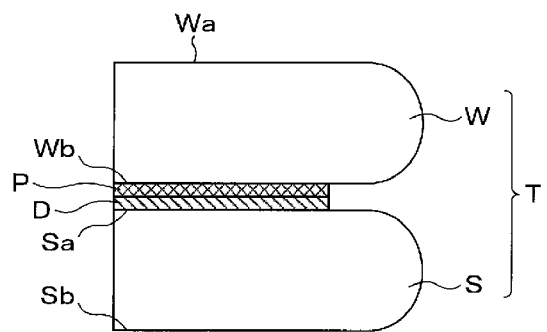
FIG. 18A and FIG. 18B are side views illustrating a schematic structure of a part of a combined wafer according to another exemplary embodiment.
Figure 18B:
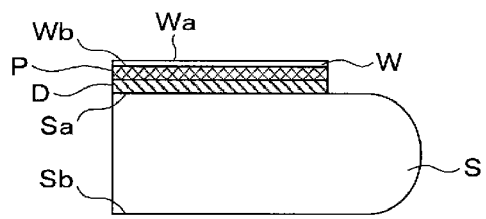

Further, to use the alkaline etching liquid as stated above, a protective film P may be formed between the rear surface Wb of the processing target wafer W and the device layer D to protect the device layer D, as shown in FIG. 18A. The protective film P may be, for example, an oxide film, and the alkaline etching liquid does not etch the protective film P. In this case, even if the front surface Wa is etched to become close to the top surface of the device layer D as shown in FIG. 18B, the protective film P can suppress the etching liquid from reaching the device layer D.

Furthermore, whether the target etching height of the front surface Wa is close to the top surface of the device layer D or not, the front surface Wa may be etched by using the alkaline etching liquid only.

Figure 19:
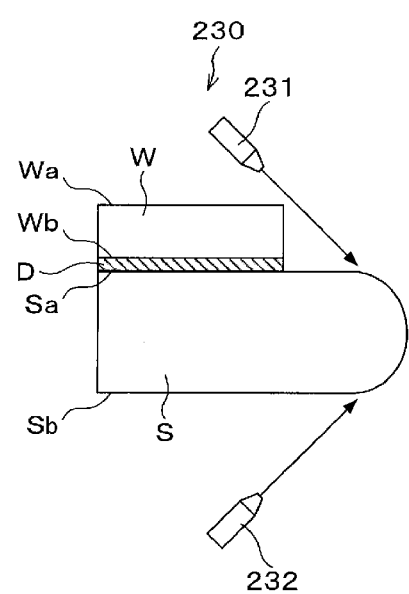
FIG. 19 is a longitudinal cross sectional view illustrating a schematic configuration of a periphery cleaning apparatus.

In the above-described exemplary embodiment, the peripheral portion of the support wafer S may be cleaned before the etching of the front surface Wa and the removing of the metal contaminant of the rear surface Sb are performed in the process A8 and after the front surface Wa is ground in the process A6. The cleaning of the peripheral portion of the support wafer S is performed by using, for example, a periphery cleaning apparatus 230 shown in FIG. 19. For example, the periphery cleaning apparatus 230 may be disposed on top of the etching apparatus 40 and the cleaning apparatus 41 in the first processing block G1.

The periphery removing apparatus 230 is equipped with an upper nozzle 231 and a lower nozzle 232 as periphery removers. The upper nozzle 231 is configured to supply a cleaning liquid onto the peripheral portion of the support wafer S from above it, and the lower nozzle 232 is configured to supply the cleaning liquid to the peripheral portion of the support wafer S from below it. The upper nozzle 231 and the lower nozzle 232 are connected to a cleaning liquid source (not shown) which stores the cleaning liquid therein.

Further, the periphery cleaning apparatus 230 is equipped with a spin chuck (not shown) configured to rotate and hold the combined wafer T. By supplying the cleaning liquid to the peripheral portion of the support wafer S from the upper nozzle 231 and the lower nozzle 232 in the state that the combined wafer T is being rotated while being held on the spin chuck, the peripheral portion is cleaned. The used cleaning liquid is collected into a cup (not shown) disposed around the spin chuck.

For example, if the metal contaminant of the rear surface Sb is removed by using the cleaning liquid E2 in the process A8, the cleaning liquid E2 may not reach the peripheral portion of the support wafer S, and, as a result, the metal contaminant of this peripheral portion of the support wafer S may not be removed sufficiently. Even in such a case, however, the metal contaminant of the peripheral portion of the support wafer S can be removed appropriately in the periphery cleaning apparatus 230.

Figure 20:
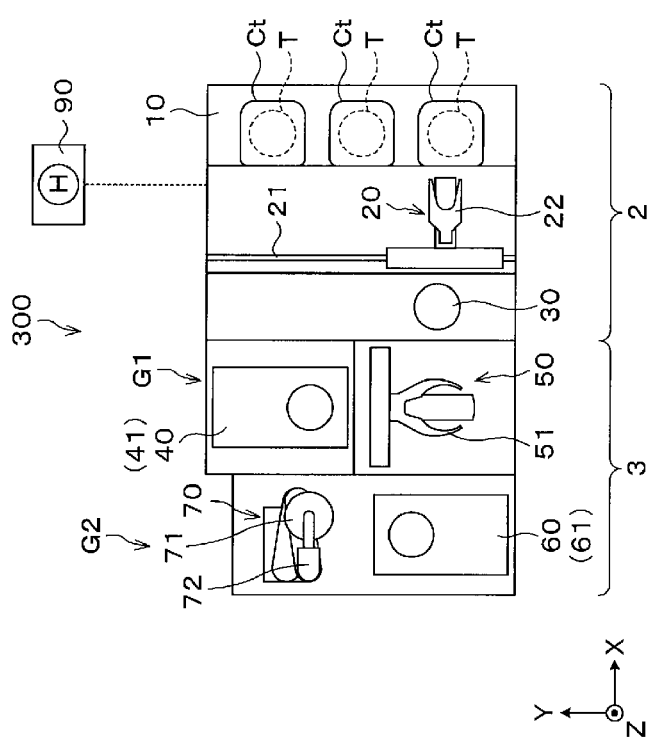
FIG. 20 is a plan view illustrating a schematic configuration of a wafer processing system according to a second exemplary embodiment.
Figure 21:
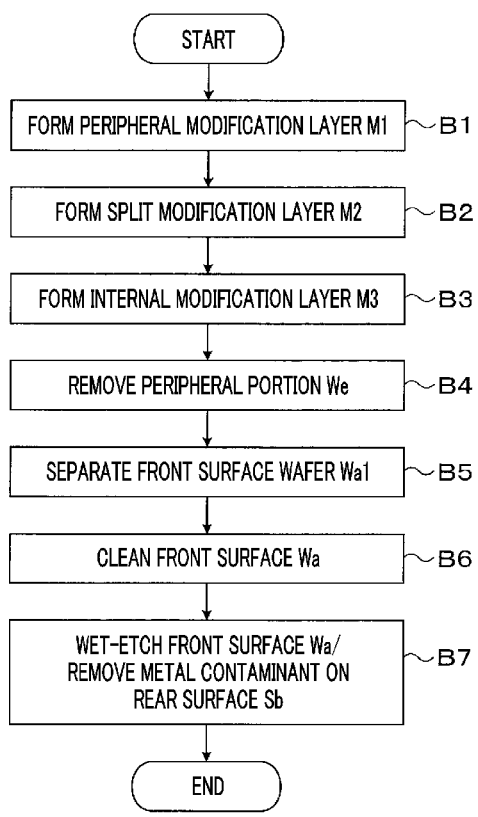
FIG. 21 is a flowchart illustrating main processes of a wafer processing according to the second exemplary embodiment.

Now, a configuration of a wafer processing system according to a second exemplary embodiment will be described. FIG. 20 is a plan view illustrating a schematic configuration of a wafer processing system 300. FIG. 21 is a flowchart illustrating main processes of a wafer processing.

As depicted in FIG. 20, the wafer processing system 300 is prepared by omitting the processing apparatus 80 from the components of the wafer processing system 1 of the first exemplary embodiment.

As illustrated in FIG. 21, formation of the peripheral modification layer M1 (process B1 of FIG. 21), formation of the split modification layer M2 (process B2 of FIG. 21), formation of the internal modification layer M3 (process B3 of FIG. 21), removing of the peripheral portion We (process B4 of FIG. 21), separation of the front surface wafer Wa1 (process B5 of FIG. 21), and cleaning of the front surface Wa (process B6 of FIG. 21) are performed in sequence in the wafer processing system 300. The processes B1 to B6 are the same as the processes A1 to A5 and A7 in the first exemplary embodiment.

Then, in the etching apparatus 40, etching of the front surface Wa by the etching liquid E1 and removing of the metal contaminant on the rear surface Sb by the cleaning liquid E2 are performed (process B7 of FIG. 21). Here, since grinding of the front surface Wa of the processing target wafer W, which is performed in the process A6 in the first exemplary embodiment, is omitted in the wafer processing system 300, thinning of the front surface Wa corresponding to the grinding of the front surface in the process A6 is also accomplished in the process B7 through the etching by the etching liquid E1.

In the present second exemplary embodiment, the same effects as obtained in the above-described first exemplary embodiment can be achieved.

Figure 22:
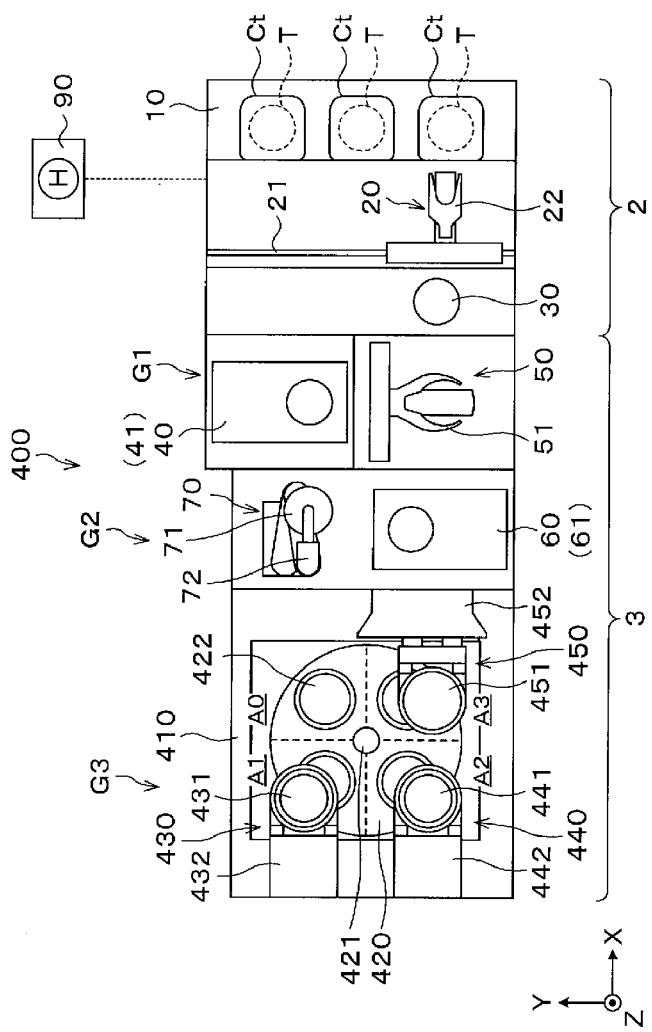
FIG. 22 is a plan view illustrating a schematic configuration of a wafer processing system according to a third exemplary embodiment.

Now, a configuration of a wafer processing system according to a third exemplary embodiment will be discussed. FIG. 22 is a plan view illustrating a schematic configuration of a wafer processing system 400.

In the wafer processing system 400, to thin the front surface Wa of the processing target wafer W, grinding of the front surface Wa is performed instead of forming the internal modification layer M3 and separating the front surface wafer Wa1 as in the first exemplary embodiment. To elaborate, the wafer processing system 400 is equipped with a processing apparatus 410 instead of the processing apparatus 80 of the wafer processing system 1 according to the first exemplary embodiment.

The processing apparatus 410 is configured to grind the front surface Wa of the processing target wafer W. The processing apparatus 410 is equipped with a rotary table 420, a rough grinding unit 430, an intermediate grinding unit 440, and a finishing grinding unit 450.

The rotary table 420 is configured to be rotated around a vertical rotation center line 421 by a rotating mechanism (not shown). Four chucks 422 each of which is configured as a holder to attract and hold the combined wafer T are provided on the rotary table 420. The chucks 422 are arranged on a circle concentric with the rotary table 420 at a regular distance therebetween, that is, at an angular distance of 90 degrees therebetween. The four chucks 422 are configured to be moved to a delivery position A0 and processing positions A1 to A3 as the rotary table 420 is rotated. Further, each of the chucks 422 is configured to be rotated around a vertical axis by a rotating mechanism (not shown). The chucks 422 include a metal component such as, but not limited to, alumina.

In the present exemplary embodiment, the delivery position A0 is a position at a positive X-axis and positive Y-axis side of the rotary table 420, and the combined wafer T is delivered to the delivery position A0. The first processing position A1 is a position at a negative X-axis and positive Y-axis side of the rotary table 420, and the rough grinding unit 430 is disposed thereat. The second processing position A2 is a position at a negative X-axis and negative Y-axis side of the rotary table 420, and the intermediate grinding unit 440 is disposed thereat. The third processing position A3 is a position at a positive X-axis and negative Y-axis side of the rotary table 420, and the finishing grinding unit 450 is disposed thereat.

In the rough grinding unit 430, the front surface Wa of the processing target wafer W is roughly ground. The rough grinding unit 430 has a rough grinder 431 which is equipped with a rough grinding whetstone (not shown) configured to be rotated in a ring shape. The rough grinding whetstone includes, for example, a metal component. Further, the rough grinder 431 is configured to be moved in a vertical direction along a supporting column 432. By respectively rotating the chuck 422 and the rough grinding whetstone while keeping the front surface Wa of the processing target wafer W held by the chuck 422 in contact with the rough grinding whetstone, the front surface Wa is roughly ground.

In the intermediate grinding unit 440, the front surface Wa of the processing target wafer W is ground to an intermediate level. The intermediate grinding unit 440 includes an intermediate grinder 441 equipped with an intermediate grinding whetstone (not shown) configured to be rotated in a ring shape. The intermediate grinding whetstone includes, for example, a metal component. Further, the intermediate grinder 441 is configured to be moved in a vertical direction along a supporting column 442. Furthermore, a particle size of abrasive grains of the intermediate grinding whetstone is smaller than a particle size of abrasive grains of the rough grinding whetstone. By respectively rotating the chuck 422 and the intermediate grinding whetstone while keeping the front surface Wa of the processing target wafer W held by the chuck 422 in contact with the intermediate grinding whetstone, the front surface Wa is ground to the intermediate level.

In the finishing grinding unit 450, the front surface Wa of the processing target wafer W is ground finely. The finishing grinding unit 450 includes a finishing grinder 451 equipped with a finishing grinding whetstone (not shown) configured to be rotated in a ring shape. The finishing grinding whetstone includes, for example, a metal component. Further, the finishing grinder 451 is configured to be moved in a vertical direction along a supporting column 452. Further, a particle size of abrasive grains of the finishing grinding whetstone is smaller than the particle size of the abrasive grains of the intermediate grinding whetstone. By respectively rotating the chuck 422 and the finishing grinding whetstone while keeping the front surface Wa of the processing target wafer W held by the chuck 422 in contact with the finishing grinding whetstone, the front surface Wa is ground finely.

Figure 23:
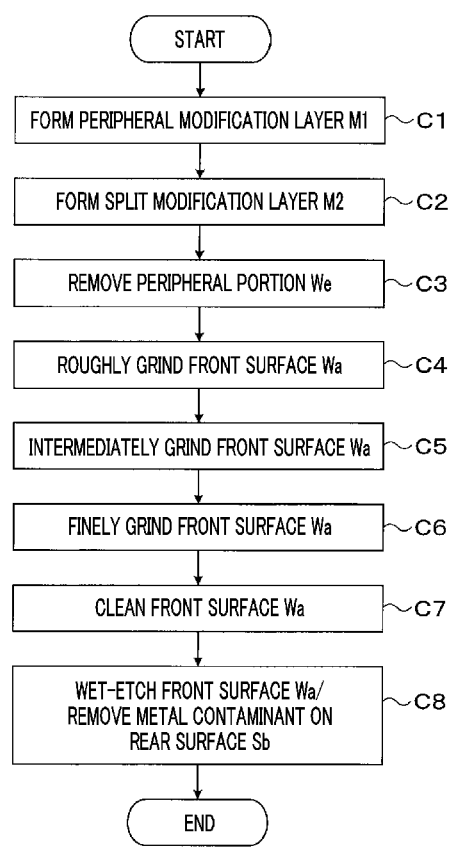
FIG. 23 is a flowchart illustrating main processes of a wafer processing according to the third exemplary embodiment.

Now, a wafer processing performed by using the wafer processing system 400 configured as described above will be explained. FIG. 23 is a flowchart illustrating main processes of the wafer processing. FIG. 24A to FIG. 24D are explanatory diagrams illustrating the main processes of the wafer processing.

Figure 24A:
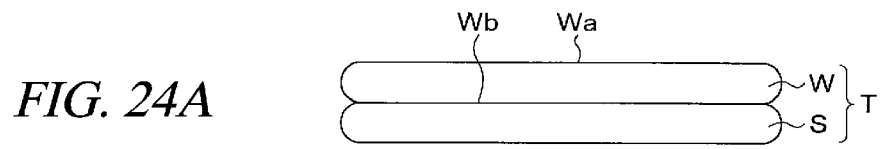
FIG. 24A to FIG. 24D are explanatory diagrams illustrating the main processes of the wafer processing according to the third exemplar embodiment.
Figure 24B:
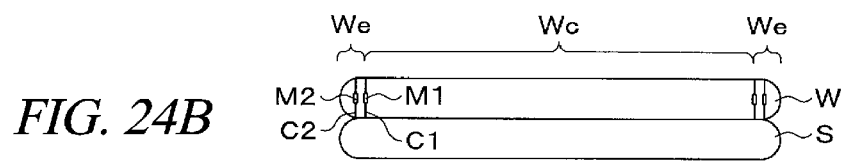

In the wafer processing system 400, in the modifying apparatus 60, the peripheral modification layer M1 is formed within the processing target wafer W (process C1 of FIG. 23), and the split modification layer M2 is also formed (process C2 of FIG. 23), as illustrated in FIG. 24A and FIG. 24B. The processes C1 and C2 are the same as the processes A1 and A2 of the first exemplary embodiment.

Figure 24C:
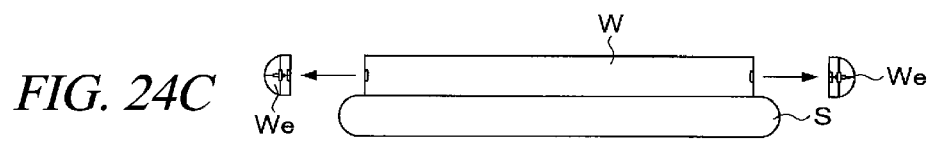

Then, in the periphery removing apparatus 61, the peripheral portion We of the processing target wafer W is removed starting from the peripheral modification layer M1, as illustrated in FIG. 24C (process C3 of FIG. 23). The process C3 is the same as the process A4 of the first exemplary embodiment.

Figure 24D:
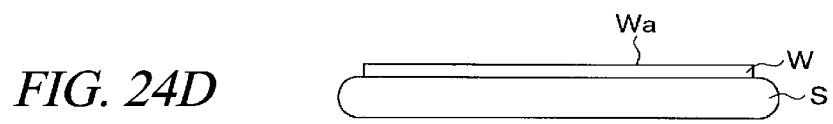

Subsequently, in the processing apparatus 410, the front surface Wa of the processing target wafer W is ground. The combined wafer T transferred into the processing apparatus 410 is delivered onto the chuck 422 which is placed at the delivery position A0. Then, the chuck 422 is moved to the first processing position A1. The front surface Wa of the processing target wafer W is ground roughly by the rough grinding unit 430, as shown in FIG. 24D (process C4 of FIG. 23).

Thereafter, the chuck 422 is moved to the second processing position A2. The front surface Wa of the processing target wafer W is ground to the intermediate level by the intermediate grinding unit 440 (process C5 of FIG. 23).

Then, the chuck 422 is moved to the third processing position A3. The front surface Wa of the processing target wafer W is finely ground by the finishing grinding unit 450 (process C6 of FIG. 23).

Next, the chuck 422 is moved to the delivery position A0. At this delivery position A0, the front surface Wa of the processing target wafer W may be cleaned by a cleaning liquid, using a cleaning liquid nozzle (not shown).

Subsequently, in the cleaning apparatus 41, the front surface Wa of the processing target wafer W is scrub-cleaned (process C7 of FIG. 23). This process C7 is the same as the process A7 of the first exemplary embodiment.

Thereafter, in the etching apparatus 40, etching of the front surface Wa by the etching liquid E1 and removing of the metal contaminant on the rear surface Sb by the cleaning liquid E2 are performed (process C8 of FIG. 23). This process C8 is the same as the process A8 of the first exemplary embodiment.

As stated above, the series of processes of the wafer processing are performed in the wafer processing system 400. In the present third exemplary embodiment, the same effects as obtained in the first exemplary embodiment can be achieved.

In the above-described exemplary embodiment, though the removing of the peripheral portion We is performed in the state that the peripheral portion We is held by the pad 180 in the periphery removing apparatus 61, the way how to remove the peripheral portion We is not limited thereto. By way of example, the peripheral portion We may be removed by applying a physical impact, an ultrasonic wave, or the like to the peripheral portion We.

Furthermore, in the above-described exemplary embodiment, although the separation of the front surface wafer Wa1 from the processing target wafer W is performed when the combined wafer T is delivered to the chuck 83 of the processing apparatus 80 from the transfer arm 71 of the wafer transfer device 70, the way how to separate the front surface wafer Wa1 is not limited thereto. By way of example, a separating device (not shown) may be provided in the same apparatus where the periphery removing apparatus 61 is provided, or this separating device (not shown) may be provided separately.

It should be noted that the exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to etch the front surface of the substrate appropriately while removing the metal contaminant on the rear surface of the substrate, after thinning the front surface of the substrate.

We claim:

1. A substrate processing method of processing a combined substrate in which a first substrate having thereon a device layer and a second substrate are bonded to each other, the substrate processing method comprising:
    processing the first substrate in a state that a rear surface of the second substrate is held by a holder;
    etching a front surface of the first substrate opposite to a surface thereof where the device layer is provided by supplying a first processing liquid to the front surface of the first substrate through a first liquid supply line connected to a first liquid source;
    removing a metal contaminant on the rear surface of the second substrate by supplying a cleaning liquid to the rear surface of the second substrate through a cleaning liquid supply line connected to a cleaning liquid source; and
    after the etching of the front surface of the first substrate and after the removing of the metal contaminant on the rear surface of the second substrate, rinsing the front surface of the first substrate and the rear surface of the second substrate at a same time by supplying pure water to the front surface of the first substrate and the rear surface of the second substrate through a pure water supply line connected to a pure water source,
    wherein the cleaning liquid is an aqueous solution including hydrogen peroxide, and
    wherein the etching of the front surface by the first processing liquid and the removing of the metal contaminant by the cleaning liquid are performed at a same time.

2. The substrate processing method of claim 1,
    wherein the etching of the front surface by the first processing liquid and the removing of the metal contaminant by the cleaning liquid are ended at a same time.

3. The substrate processing method of claim 1,
    wherein at a lateral side of the combined substrate, the first processing liquid does not reach the device layer while the cleaning liquid reaches the device layer.

4. The substrate processing method of claim 1, further comprising:
    forming an internal modification layer within the first substrate by radiating laser light along a plane direction thereof from a modifying device;
    separating, by a separating device, a front surface portion of the first substrate from the first substrate, starting from the internal modification layer formed by the modifying device; and
    grinding, by a processing device, the front surface of the first substrate bonded to the second substrate after the first substrate is separated by the separating device,
    wherein the first processing liquid is supplied to the front surface of the first substrate ground by the processing device.

5. The substrate processing method of claim 1, further comprising:
    forming an internal modification layer within the first substrate by radiating laser light along a plane direction thereof from a modifying device; and
    separating, by a separating device, a front surface portion of the first substrate from the first substrate, starting from the internal modification layer formed by the modifying device,
    wherein the first processing liquid is supplied to the front surface of the first substrate bonded to the second substrate, after the first substrate is separated by the separating device.

6. The substrate processing method of claim 1, further comprising:
    grinding the front surface of the first substrate by a processing device,
    wherein the first processing liquid is supplied to the front surface of the first substrate ground by the processing device.

7. The substrate processing method of claim 1, further comprising:
    cleaning a peripheral portion of the second substrate by a periphery cleaning device before the cleaning liquid is supplied to the rear surface of the second substrate.

* * * * *